(12) United States Patent
Roehm et al.

(10) Patent No.: US 7,265,289 B2
(45) Date of Patent: Sep. 4, 2007

(54) ELECTRONIC MODULE

(75) Inventors: Thomas Roehm, Konstanz (DE); Michael Strauss, Isselburg (DE); Peter Wienzek, Luedenscheid (DE)

(73) Assignee: i f m electronic GmbH, Essen (DE)

( * ) Notice: Subject to any disclaimer, the term of this patent is extended or adjusted under 35 U.S.C. 154(b) by 0 days.

(21) Appl. No.: 10/771,157

(22) Filed: Feb. 4, 2004

(65) Prior Publication Data
US 2004/0246686 A1 Dec. 9, 2004

(30) Foreign Application Priority Data
Feb. 5, 2003 (DE) .............................. 103 04 765
Nov. 25, 2003 (DE) .............................. 103 55 350

(51) Int. Cl.
*H05K 5/00* (2006.01)
(52) U.S. Cl. ................... 174/50; 174/59; 174/520; 174/17 R; 361/600; 361/752
(58) Field of Classification Search .................. 174/59, 174/52.1, 50, 53, 52.3, 54, 57, 58, 61, 17 R, 174/520, 559, 561; 220/3.2, 3.3, 3.9, 4.02; 439/535, 538, 949; 361/600, 601, 724, 730, 361/796, 752; 248/906
See application file for complete search history.

(56) References Cited

U.S. PATENT DOCUMENTS

| | | | | |
|---|---|---|---|---|
| 3,782,858 | A | * | 1/1974 | Deters .......................... 417/26 |
| 5,065,282 | A | * | 11/1991 | Polonio ....................... 361/752 |
| 6,222,441 | B1 | * | 4/2001 | Siegwarth .............. 340/538.16 |
| 6,462,271 | B2 | * | 10/2002 | Coffin et al. ................ 174/52.1 |

FOREIGN PATENT DOCUMENTS

DE 196 16 658 A1 9/1997
DE 197 56 167 A1 7/1999

* cited by examiner

*Primary Examiner*—Angel R. Estrada
(74) *Attorney, Agent, or Firm*—David S. Safran

(57) ABSTRACT

An electronic module (1) for connection of sensors or actuators to a bus line, with an electronic unit, with several jacks (3) for connection of electrical lines (4), and with one jack (5) and one plug (6) for connection of two bus lines (7). The electronic module (1) is especially well suited for use in the hygiene or foodstuffs fields since there is at least one mounting foot (9) for mounting of the electronic module (1) on a support surface (10) and that the housing (2) is made such that the edge area (14) of the housing bottom (12) is further from the support surface (10) than is the area of the housing by the mounting foot (9).

22 Claims, 7 Drawing Sheets

ELECTRONIC MODULE

BACKGROUND OF THE INVENTION

1. Field of the Invention

The invention relates to an electronic module for connection of sensors or actuators to a bus line, with a housing, with an electronic unit, with at least one jack or a plug for connection of electrical, optical, pneumatic or hydraulic lines, with at least one jack or one plug for connection of at least one bus line.

2. Description of Related Art

These electronic modules are used to connect several sensors or actuators to a bus line via which sensors and actuators are connected both to power and also to a central control. The bus line is generally an unshielded two-lead ribbon cable or standard round cable via which signals and power are transmitted at the same time. The electronic module is generally comprised of a circuit board which is assembled according to requirements and which is kept in a housing. If the jack and/or the plug is used for connection of pneumatic or hydraulic lines, pneumatic valves and/or hydraulic valves are also installed in the electronic unit. The advantage of known bus systems is that it is no longer necessary for each actuator or sensor to be wired individually, but instead, only one bus line is needed to connect all actuators and sensors to the control. In this way, the system becomes much easier to install and start-up of machinery and systems become simpler.

In order to be able to quickly and easily connect the individual actuators and sensors to the bus line, the initially described electronic module is used, which is often also called an actuator-sensor box or actuator-sensor module. The jacks for the sensors are called inputs and the jacks for the actuators are called outputs so that the electronic modules are also called input/output modules or I/O modules.

A first type of module is comprised of a module top part, the so-called user module, and a module bottom part, the so-called coupling module (see, published German Patent Application DE 197 56 167 A1). The coupling module is used to connect the user module to the bus line, for which there are the corresponding pin or knife-edge contacts for making contact with the bus line in the coupling module. The user module and the coupling module are likewise electrically connected to one another via pin contacts and mechanically connected to one another via screws in the user module. The user modules differ especially in the number of terminal jacks or sockets, the majority of the user modules having four or eight M12 jacks for connection of a corresponding number of binary devices.

In another type of electronic module, the connection to the bus line takes place, not via the coupling module, but via a separate line which is connected to a jack or plug which is located in the module. For this type of module, the housing is, likewise, also made in two-parts, so that the housing has a housing top part and a housing bottom part. However, the housing bottom part does not have the function of the above described coupling module since the connection to the bus line does not take place via the housing bottom part. Instead, the housing bottom part is used for connection of the electronic module to a support surface, for example, to the wall of a tank or machine, so that the housing bottom part is used as a mounting plate. Furthermore, these electronic modules generally have a cuboidal plastic housing which, for connection of the electronic module, rest over a large area on a straight support surface which is largely parallel to the housing, the fixing of the electronic module taking place using screws, for which there are the corresponding holes in the housing.

Under ambient conditions with loading by permanently elevated humidity or in applications in which cleaning of the electronic modules takes place with a water jet, especially with a high pressure cleaner such as, for example, in the foodstuffs or beverage industry, the known electronic modules can hardly be used. Especially in the food and beverage domain are very high demands imposed not only on the sealing of the housing, but also on the capability of the housing to be cleaned, especially in the transition area to the support surface. Here, the deposition of germs on the housing or in the transition area from the housing to the support surface must be avoided as much as possible. The resting of the cuboidal housing on the support surface over a large area however entails the danger of deposition of germs since the available support surface is generally relatively uneven and rough so that germs can easily settle in the transition area from the housing to the support surface.

SUMMARY OF THE INVENTION

Thus, a primary object of this invention is to provide an electronic module which better meets the high demands of the hygiene and foodstuffs domain. More specifically, this invention seeks to achieve this object relative to an electronic module according to the above mentioned second type of electronic module in which the connection to the bus line takes place via at least one jack which is located in the housing or one plug.

In the electronic module of the invention this object is achieved, first of all, essentially in that there is at least one mounting foot for mounting of the electronic module on a support surface and that the housing is made such that the housing bottom, with reference to the support surface, has a greater distance in the edge area than in the area of the mounting foot or mounting feet.

Making at least one mounting foot, first of all, results in the housing being spaced apart from the support surface, by which cleaning of the area between the housing bottom and the support surface is enabled. Here, it is such that, on the one hand, the possibility of cleaning becomes better, the farther the housing is spaced away from the support surface, and on the other hand, generally, only a limited installation space is available so that both for reasons of space and also for reasons of stability, the height of the electronic module cannot be increased arbitrarily. These two contradictory requirements are especially easily met in the electronic module of the invention in that the housing bottom has an increasing distance from the support surface in a direction from the mounting foot to the edge area. In this way, in spite of the limited overall height of the electronic module good cleaning of the area between the housing and the support surface is possible.

Advantageously, the electronic module of the invention has a two-part housing with a housing top part and a housing bottom part. In this way, both production of the housing and also the arrangement of the electronic unit and the jacks or plugs in the housing can be provided especially easily.

In order to meet the increased requirements for tightness of the housing, it is advantageously provided that the jacks and/or the plugs are made in one piece with the housing top part. Here, the housing top part can be made, for example, produced as a casting, such that the jacks or the plugs are integrated in the housing top part. In addition, it is also possible to connect the jacks or the plugs to the housing top part in one piece by welding the jacks or plugs to the housing top part. Due to the single-piece execution of the jacks or plugs with the housing top part, the otherwise necessary sealing measures between the jacks and the plugs and the openings corresponding to them in the housing top part are eliminated, by which the electronic module of the invention, overall, has a much higher tightness than conventional electronic modules.

In order to further increase the tightness and enhance the possibility of cleaning of the electronic module, in accordance with the invention, it is preferably provided that the housing has a round base surface. By minimizing the number of edges on the housing, both the tightness of the housing is increased and also the tendency of the housing to fouling is reduced, and the possibility of cleaning the housing is improved.

In the preferred embodiment of the housing with a round base area, the connection of the housing top part and the housing bottom part can advantageously take place such that the housing top part has a thread, for example, an inside thread, and the housing bottom part has a corresponding thread, for example, an outside thread, so that the housing top part and the housing bottom part can be screwed directly to one another. In contrast to the screwed connection of the housing top part and the housing bottom part known from the prior art, in which there are individual screws only in the area of the corners of the cuboidal housing, when the housing top part and the housing bottom part are screwed directly to one another an improved tightness of the entire housing results. In doing so, the tightness can be further increased by the arrangement of the corresponding gaskets.

According to another embodiment of the electronic module of the invention, in which the housing likewise advantageously has a round base surface, the housing top part and the housing bottom part are connected to one another by interlocking. The interlocking is accomplished preferably by the edge of the housing top part extending around the edge of the housing bottom part, between the edge of the housing top part and the edge of the housing bottom part, there being a sealing element and then the edge of the housing top part and the edge of the housing bottom part are permanently connected to one another by folding or crimping. In this type of connection of the housing top part to the housing bottom part, on the one hand, the housing top part and the housing bottom part can be produced very easily, for example, by punching and bending or pressing, and on the other hand, reliable sealing of the housing interior can nevertheless be achieved by a corresponding configuration of the sealing element.

Depending on the requirement for tightness of the housing, in addition, it is also possible to weld the housing top part and the housing bottom part to one another or to connect them to one another by means of a catch connection, at least for a catch connection generally an additional seal being necessary.

The possibility of cleaning the area between the housing and the support surface can be further enhanced by there being only exactly one mounting foot, so that a mounting area which has been reduced to one point results. The mounting foot is preferably located in the area of the axis of the electronic module.

With respect to the execution of the mounting foot there are various possibilities. According to one configuration of the electronic module in accordance with the invention, the mounting foot has at least one screw and the housing is made to be able to turn and/or swivel relative to the mounting foot. In this way, the alignment of the electronic module with respect to the arrangement of the connections can be optimally matched to the respective circumstances on site. In particular, the housing can be aligned such that the display elements which are located in the electronic module are easily visible.

Advantageously, the housing bottom part and the mounting foot are connected to one another such that the housing bottom part is fixed axially relative to the mounting foot, but can turn around the lengthwise axis of the mounting foot. To do this, the housing bottom part has a receiver for the mounting foot which has an insertion end, the receiver being provided with an inside groove and the insertion end with a corresponding outside groove and a lock washer or a snap ring is inserted into the inside groove or the outside groove. In addition to the axial safeguard which is implemented in this way, there is preferably also an anti-rotation element, and both the axial safeguard and also the anti-rotation element can be made in particular such as is described in published German Patent Application DE 196 16 658 A1 for connecting the bottom part of a measurement device to the top part of a measurement device.

According to another embodiment of the electronic module of the invention, the mounting foot is made as a punched and bent part, the mounting foot or the punched and bent part having two legs which are arranged at an angle of less than 90 degrees relative to one another. This mounting foot can be produced very easily, by placing the two legs at an angle of less than 90 degrees relative to one another, the result being that the top of the housing is tilted when the support surface is horizontal. In this way, on the one hand, the operator surface of the electronic module is inclined, by which its accessibility is facilitated, and on the other hand, the result is that spray water automatically flows off when the housing is cleaned so that "puddling" on the top of the housing is prevented. The mounting foot can be attached to the housing, especially to the housing bottom part, by welding, especially by resistance welding.

In particular, there are a plurality of possibilities for embodying and developing the electronic module in accordance with the invention. In this regard, a detailed description of preferred embodiments is provided in conjunction with the accompanying drawings.

DETAILED DESCRIPTION OF THE INVENTION

Figure 1:
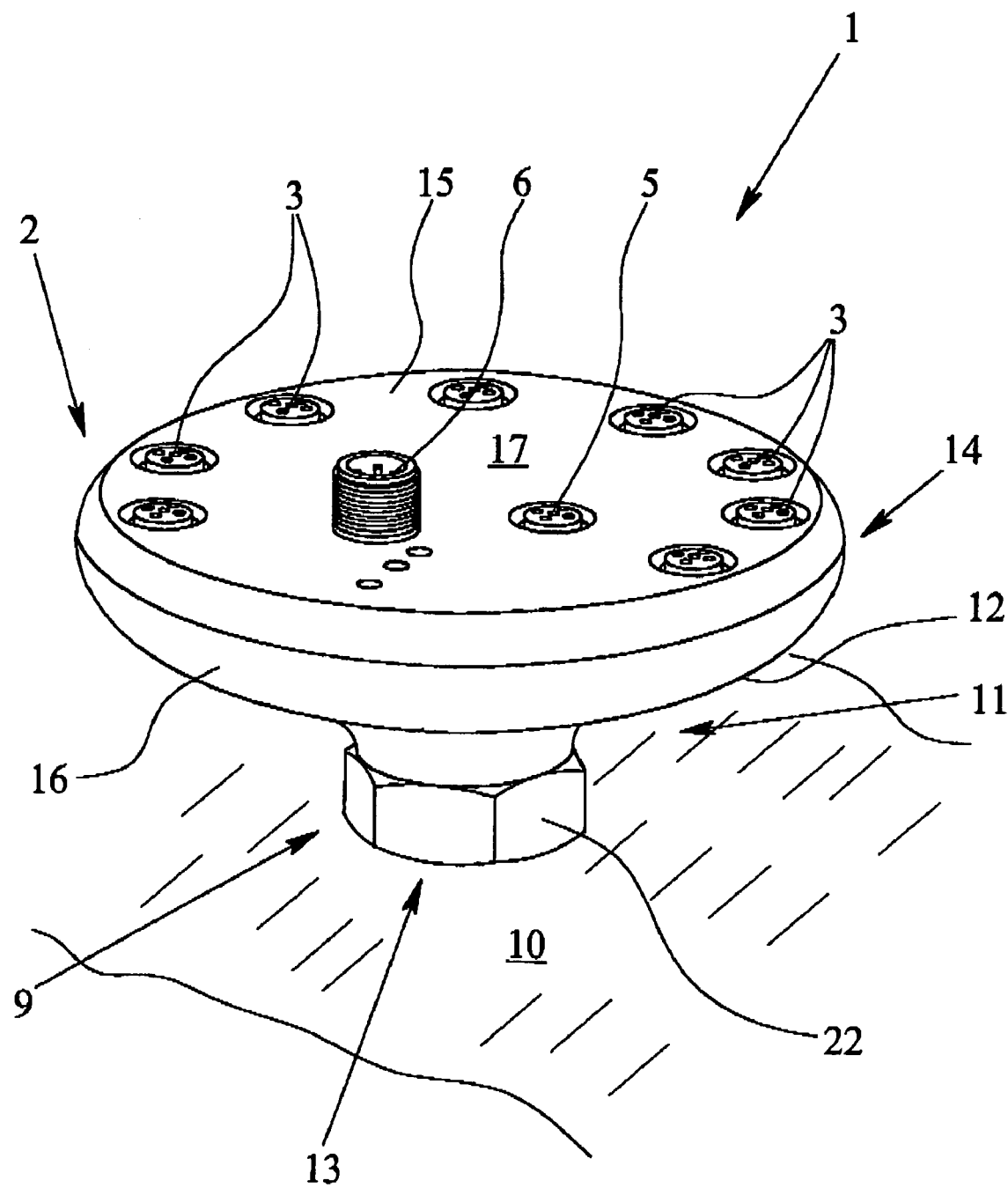
FIG. 1 shows a perspective of a first embodiment of an electronic module in accordance with the invention.
Figure 4:
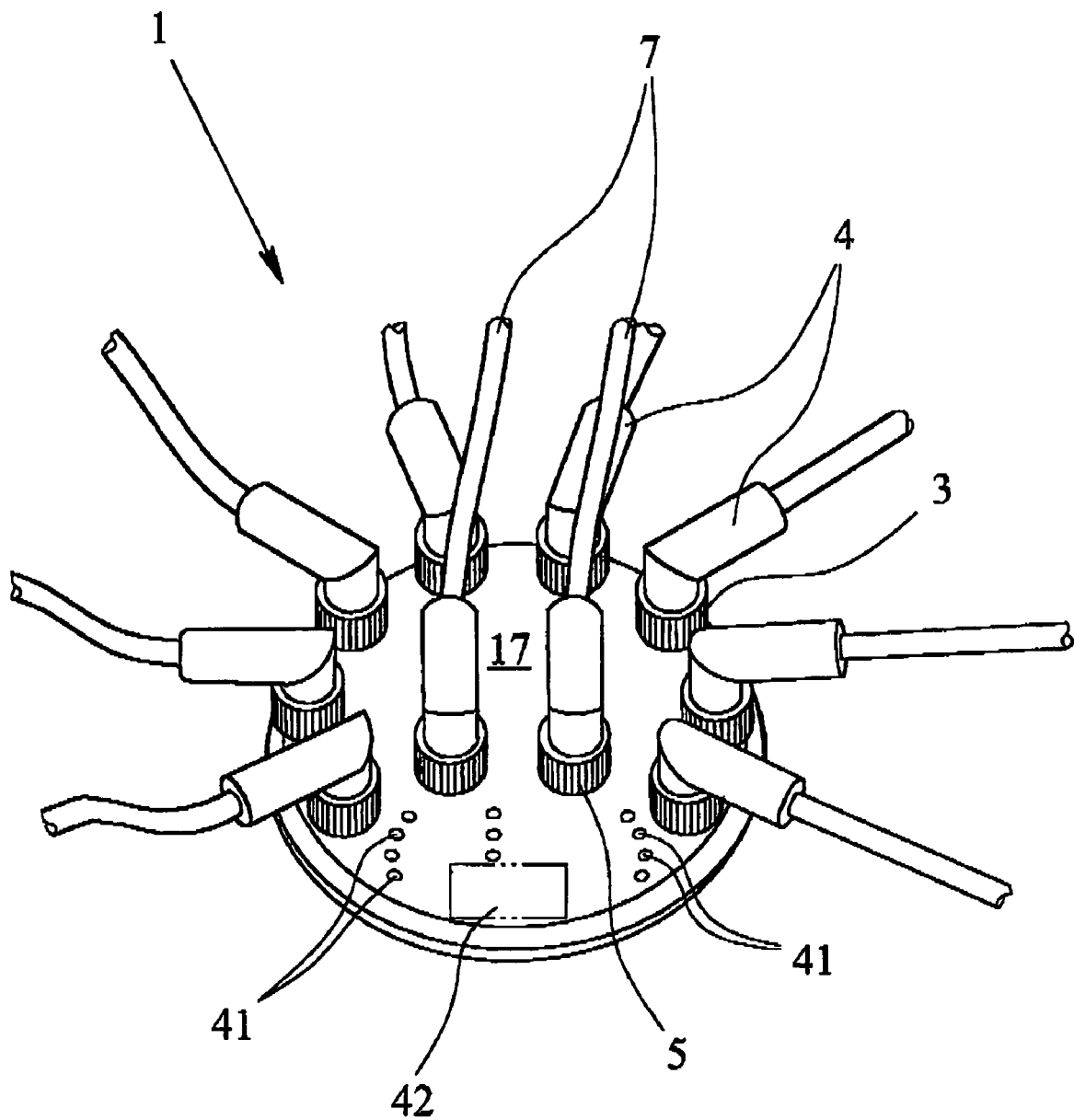
FIG. 4 is a perspective view of the top of the electronic module shown in FIGS. 1 to 3, with the lines connected.

FIG. 1 shows a first preferred embodiment of an electronic module 1 that has a housing 2, with a total of eight jacks for connection of the electrical lines 4 shown in FIG. 4 and with one jack 5 and one plug 6 for connection of a bus line 7 which is likewise shown only in FIG. 4. Using this electronic module 1, it is possible for a total of eight sensors or actuators, which are connected to the lines 4, to connect to the bus line 7. The electrical connection of the jacks 3 to the jack 5 or the plug 6 takes place via the electronic unit which is located within the housing 2 and which comprises a circuit board 8 which has been assembled accordingly. The assembly of the circuit board 8 depends especially on whether conventional sensors and actuators or "intelligent" sensors or actuators which internally have an electronic unit for matching signals to the bus line are to be connected to the electronic module 1.

In the embodiment of the electronic module 1 of the invention, as shown in FIGS. 1 to 4, there is exactly one mounting foot 9 for mounting of the electronic module 1 on a support surface 10, for example, a housing wall or a machine part. In order to be able to clean the intermediate space 11 between the bottom 12 of the housing and the support surface 10 as well as the transition area 13 between the mounting foot 9 and the support surface 10 as well as possible, the bottom 12 of the housing has a greater distance with reference to the support surface 10 in the edge area 14 than in the area of the mounting foot 9. The bottom 12 of the housing thus has a distance from the support surface 10 which increases from the mounting foot 9 to the edge area 14 so that even at a relatively low total height of the electronic module 1, cleaning of the entire intermediate space 11 is possible. Because the electronic module 1 as shown in FIGS. 1 to 4 has a round base area and a housing shape similar to an ellipsoid of revolution, both the electronic module 1 and also the support surface 10 can be easily cleaned from all sides.

The electronic module 1 shown in FIG. 1 has a diameter of from roughly 100 to 150 mm and a height of from roughly 40 to 60 mm so that, on the one hand, the amount of space required for the electronic module 1 is very low, and on the other hand, the electronic module 1 is also mechanically very durable and stable due to the compactness and the shape.

Figure 2A:
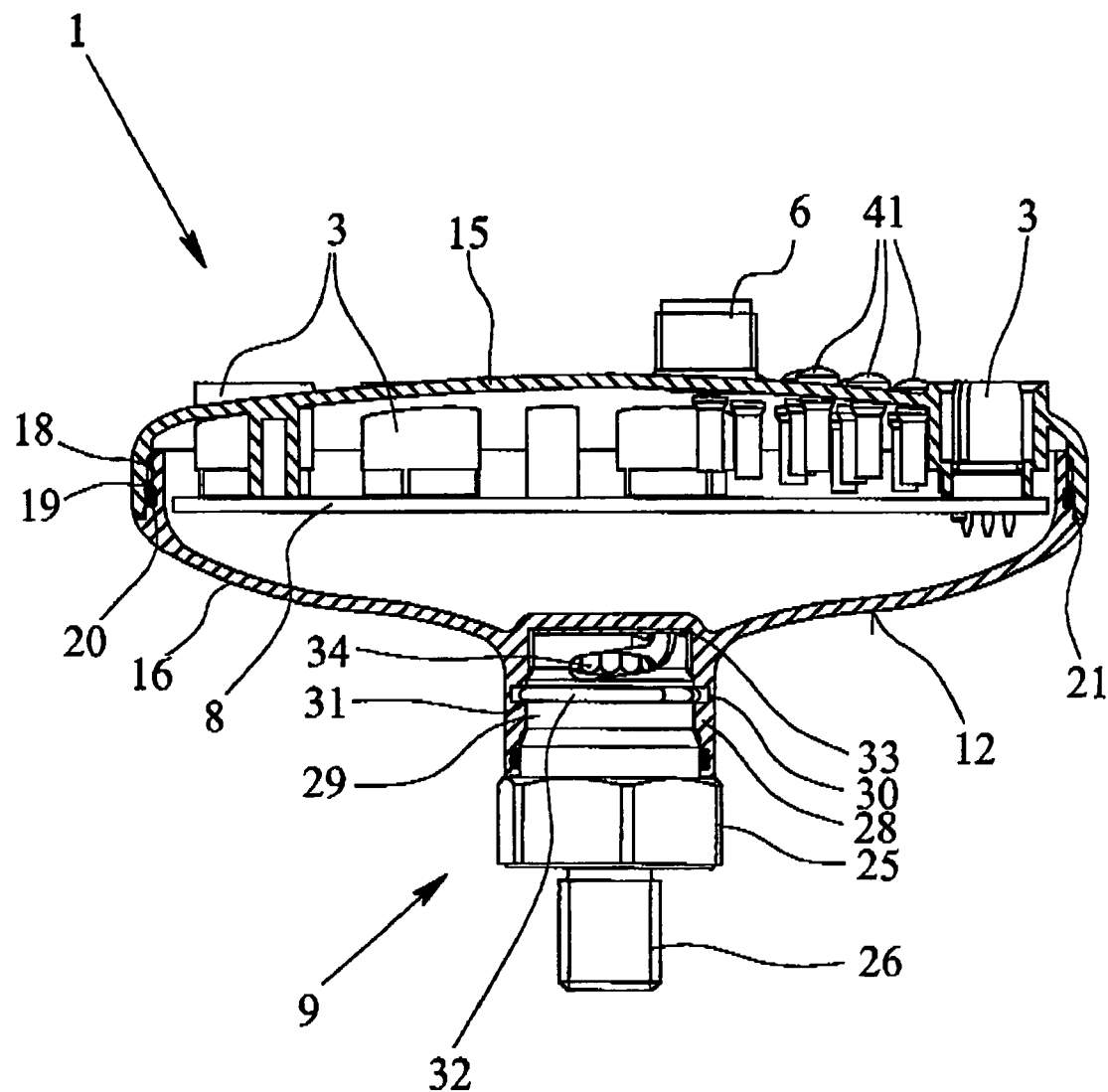
FIG. 2a is a sectional view of the electronic module of FIG. 1.
Figure 2B:
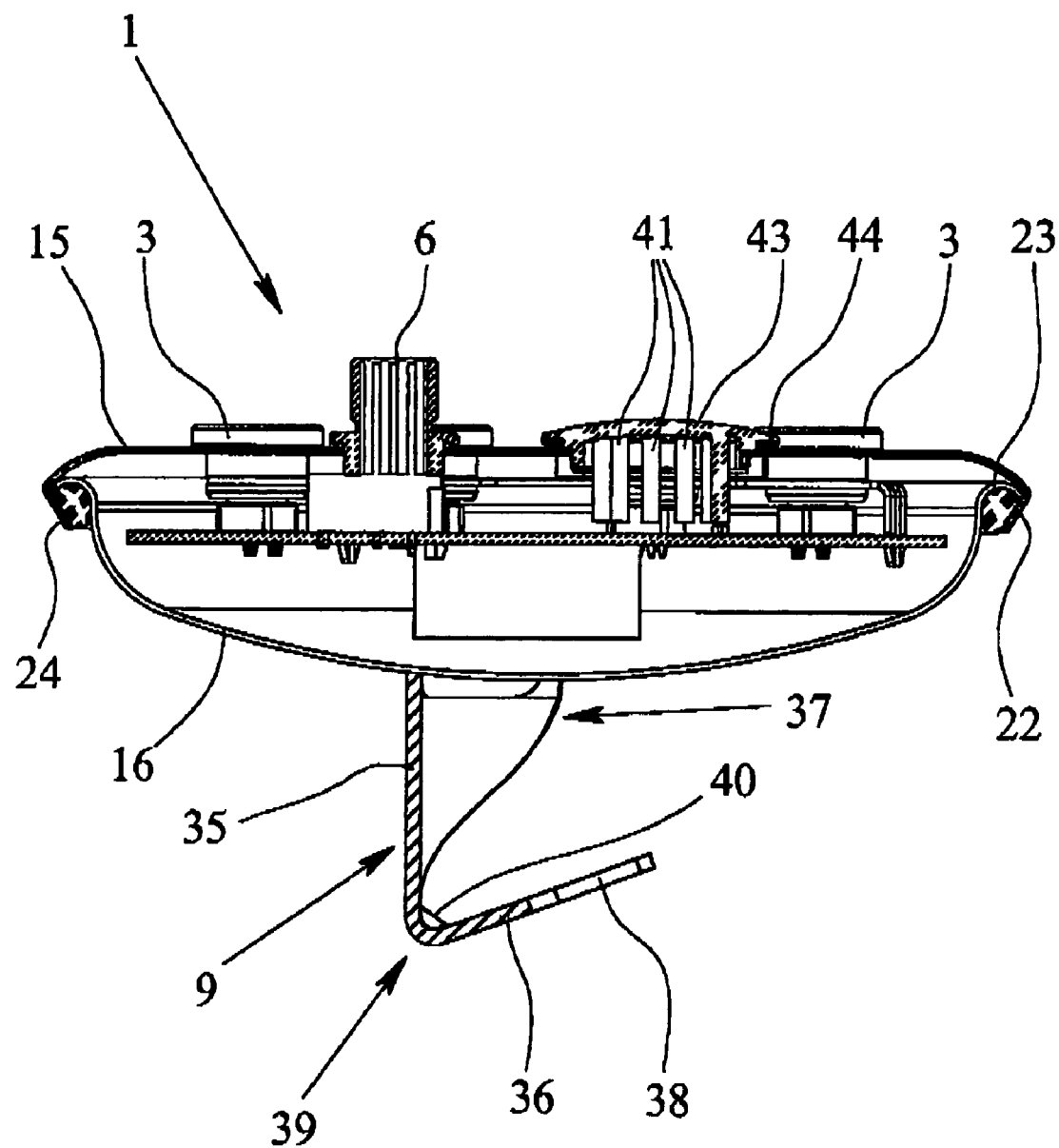
FIG. 2b is a sectional view of an alternative embodiment of the electronic module, FIGS. 3a & 3b each show a perspective view of the electronic module as shown in FIG. 1 and FIG. 2a, with two different versions of the mounting foot.

FIGS. 2a & 2b show that the electronic module 1 has a two-part housing 2 with a housing top part 15 and a housing bottom part 16. Moreover, FIGS. 2a & 2b show that the increasing distance of the housing bottom 12 relative to the support surface 10 in the direction from the mounting foot 9 to the edge area 14 is accomplished by the bottom 12 of the housing having the shape of an arch or a circular arc in a section. Likewise, the housing top part 15 of the electronic module 1 shown in FIG. 2a has a top 17 in the shape of an arch or circular arc, by which, when the electronic module 1 is cleaned, "puddling" on the top 17 of the housing 2 is prevented since the water or detergent drains toward the edge.

In order to increase the tightness of the housing 2, the jacks 3, 5 and the plug 6 are made in one piece with the housing top part 15 so that additional sealing is not necessary at these points. Moreover, the tightness of the housing 2 in the electronic module 1, as shown in FIG. 2a, is increased by the housing top part 15 having an inside thread 18 and the housing bottom part 16 having a corresponding outside thread 19 so that the housing top part 15 and the housing bottom part 16 can be screwed directly to one another. A screw connection of this type, which acts over the entire circumference of the housing 2, leads to a much smaller gap size between the housing top part 15 and the housing bottom part 16, and thus, to higher tightness of the housing 2. Of course, it is also possible to interchange the arrangement of the inside thread 18 and the outside thread 19 so that the housing top part 15 has an outside thread and the housing bottom part 16 has an inside thread. In addition, in the electronic module 1 shown in FIG. 2a, sealing takes place by the radially acting O-ring 20. Of course, still other sealing elements can also be located, for example, in the area of the bevel 21, in order to seal the existing joint spaces.

In the preferred embodiment of the electronic module 1 as shown in FIG. 2b, the connection of the housing top part 15 and the housing bottom part 16 is accomplished not by a screw connection, but instead is produced by folding or crimping of the edge 22 of the housing top part 15. For this purpose, on the one hand, the edge 22 of the housing top part 15 extends around the edge 23 of the housing bottom part 16, and on the other hand, the edge 23 of the housing bottom part 16 is bent to the outside such that an O-ring 24 can be inserted into the edge 23. When the edge 22 of the housing top part 15 is turned down, then both the hosing top part 15 is undetachably connected to the housing bottom part 16 and the O-ring 24 is clamped so that the interior of the housing 2 is completely and permanently sealed. To minimize the gap size between the edge 22 of the housing top part 15 and the edge 23 of the housing bottom part 16, the O-ring 24 is made as a shaped seal.

Figure 3A:
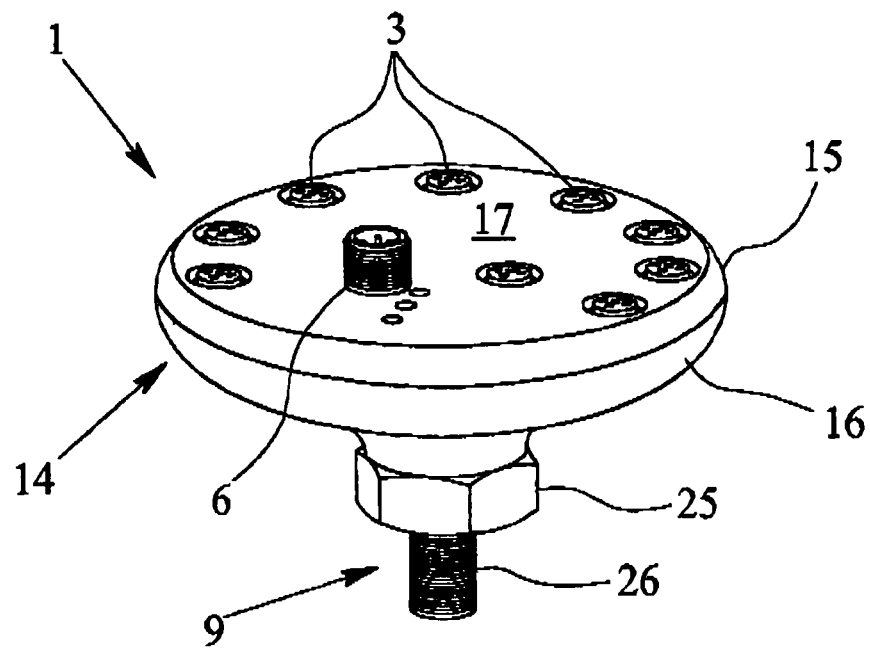
Figure 3B:
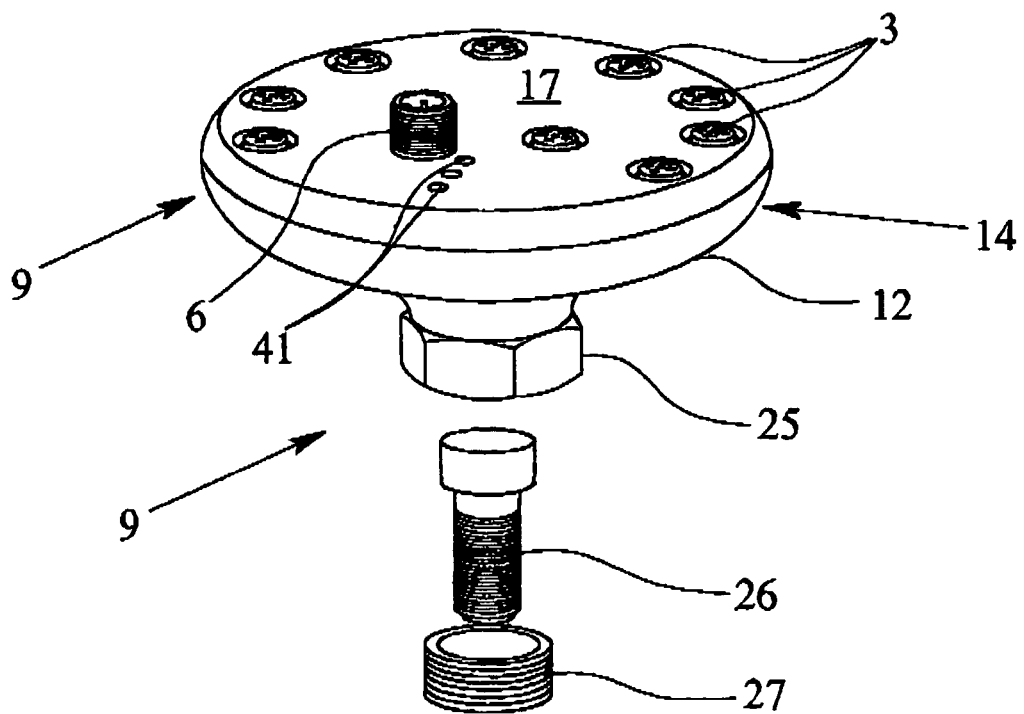

FIGS. 3a & 3b show two electronic modules 1 with two different versions of a first embodiment of the mounting foot 9. The electronic module 1 as shown in FIG. 3a, in addition to a key surface 25 in the form of a hexagon, has only a screw 26 which is securely connected to the key surface 25. Conversely, the mounting foot 9 in the electronic module 1 as shown in FIG. 3b, in addition to the key surface 25 and the screw 26, has an adapter 27. By using the adapter 27, different standard screws 26 can be used for screwing the electronic module 1 into a corresponding hole in the support surface 10.

In the preferred embodiment of the electronic module 1 of the invention, the housing 2 is made to be able to turn relative to the mounting foot 9. Here, the housing bottom part 16 is joined to the mounting foot 9 such that the housing bottom part 16 is axially fixed relative to the mounting foot 9, but can be rotated around the lengthwise axis of the mounting foot 9. To do this, the housing bottom part 16 has a receiver 28 for the insertion end 29 of the mounting foot 9. The receiver 28 is provided with an inside groove 30 and the insertion end 28 of the mounting foot 9 is provided with an outside groove 31, a snap ring 32 being inserted into the inside groove 30 of the receiver 28. In the untensioned state of the snap ring 32, its outside diameter is smaller than the diameter of the inside groove of the receiver 28 and its inside diameter is smaller than or equal to the diameter of the outside groove 31 of the insertion end 29. At this point, if the insertion end 29 of the mounting foot 9 is inserted into the receiver 28 of the housing bottom part 16, the snap ring 32 is tensioned by the insertion end 29 and pressed into the inside groove 30, by which axial fixing of the housing bottom part 16 and the mounting foot 9 is achieved.

Instead of the above described implementation of axial fixing, it is also possible at the start of installation to insert a snap ring 32 into the outside groove 31 of the insertion end 29 of the mounting foot 9. Then, the inside diameter of the snap ring 32 in the retensioned state must be greater than the diameter of the outside groove 31 of the insertion end 29 of the mounting foot 9 and the outside diameter of the snap ring 32 must be greater than or equal to the diameter of the inside groove 30 of the receiver 28.

Moreover, in the receiver 28 of the housing bottom part 16, there is at least one catch lever 33 which interacts with a corresponding catch groove 34 in the insertion end 29 of the mounting foot 9. In this way, not only is free rotation but also locking in certain positions of the housing 2 relative to the mounting foot 9 possible, so that an exact and permanent adjustment between the electronic module 1 and the support surface 10 is ensured.

Figure 5A:
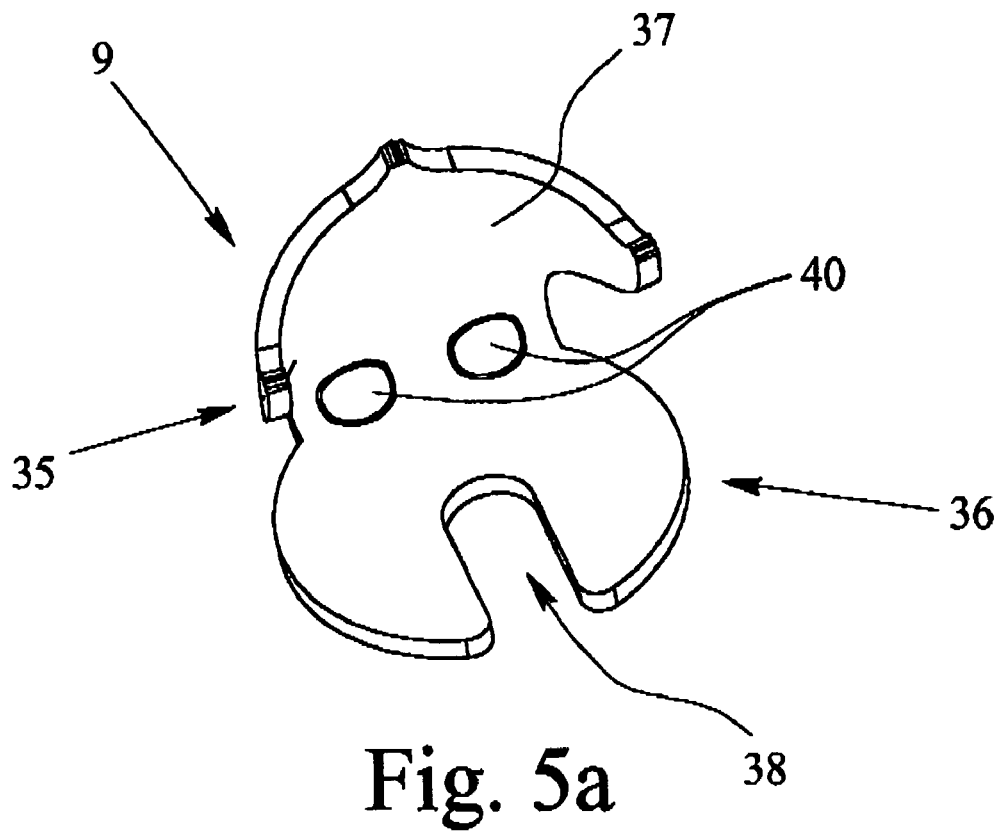
FIGS. 5a and 5b are perspective views of the mounting foot of the version of the electronic module shown in FIG. 2b.
Figure 5B:
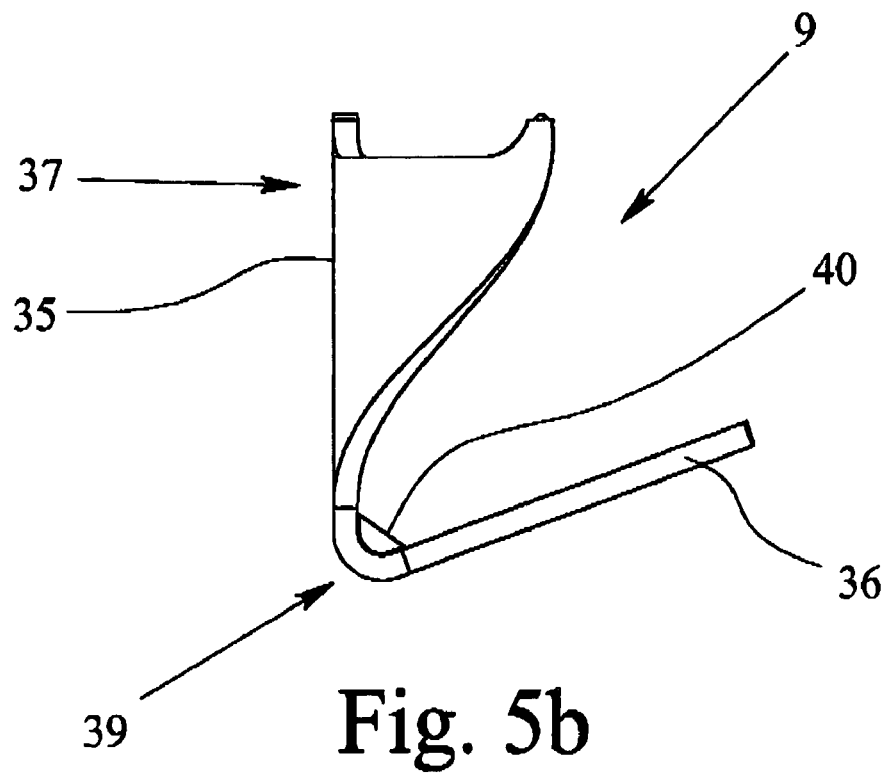

Another configuration of the mounting foot 9 is shown in FIG. 2b and in FIG. 5. Here, the mounting foot 9 is made as a punched and bent part and has two legs 35, 36 which are arranged at an angle of roughly 70 degrees relative to one another. Because the angle between the two legs 35, 36 is less than 90 degrees, when the mounting foot 9 or the second leg 36 is mounted on a horizontal support surface 10, the result is that the top 17 of the housing 2 is tilted. To ensure a good, permanent connection of the mounting foot 9 or of the first leg 35 to the housing bottom part 16, the upper area 37 of the mounting foot 9 is made semicircular. The mounting foot 9 can then be joined especially easily to the housing bottom part 16 by resistance welding, in the embodiment shown in FIGS. 2b and 5, a 3-point weld being provided between the mounting foot 9 and the housing bottom part 16.

As is especially apparent from FIGS. 2b and 5a, an elongated hole 38 is formed in the second leg 36 with which the mounting foot 9 is mounted on the support surface 10. By forming an elongated hole 38 which is open toward one side, an especially simple positioning of the mounting foot 9, and thus of the electronic module 1, is possible. Finally, in the transition area 39 between the first leg 35 and the second leg 36 of the mounting foot 9, two stiffening beads 40 are formed which are designed to prevent unwanted oscillation or vibration of the mounting foot 9.

As is especially apparent in FIG. 4, the electronic module 1 has several LEDs 41 and a label field 42, the LEDs 41 and the label field 42, on the one hand, and the jacks 3, 5 and the plug 6, on the other hand, being arranged such that both the LEDs 41 and also the label field 42 are visible even with the lines 4 and 7 connected. This is achieved at least in part by the jacks 3 being arranged in the shape of a circular arc on the circumference of the housing 2 and the jack 5 and the plug 6 being arranged set back in the direction of the center axis of the electronic module 1. For easier assignment of the individual jacks 3 to the corresponding LEDs 41, the LEDs 41 are arranged in a semicircle according to the jacks 3.

In the embodiment of the electronic module 1 as shown in FIG. 2b, the LEDs 41 are covered by a protective cap 43 of transparent material. In this way, the LEDs 41, on the one hand, are mechanically protected, and on the other, the tightness of the housing 2 can be further increased, for which purpose there is an O-ring 44 between the edge of the protective cap 43 and the surface 17 of the housing top part 15. The electronic module 1 as shown in FIG. 2b is preferably made of sheet metal, especially of V4A sheet metal, by which the housing top part 15 and the housing bottom part 16 can be produced especially easily, and as already described above, can be connected to one another by folding or crimping. The O-rings 24, 44, are preferably made of ethylene-propylene rubber (EPM) or of ethylene-propylene-diene rubber (EPDM) which has the property of especially high tightness and can also be used in the food and beverage industry.

Figure 6:
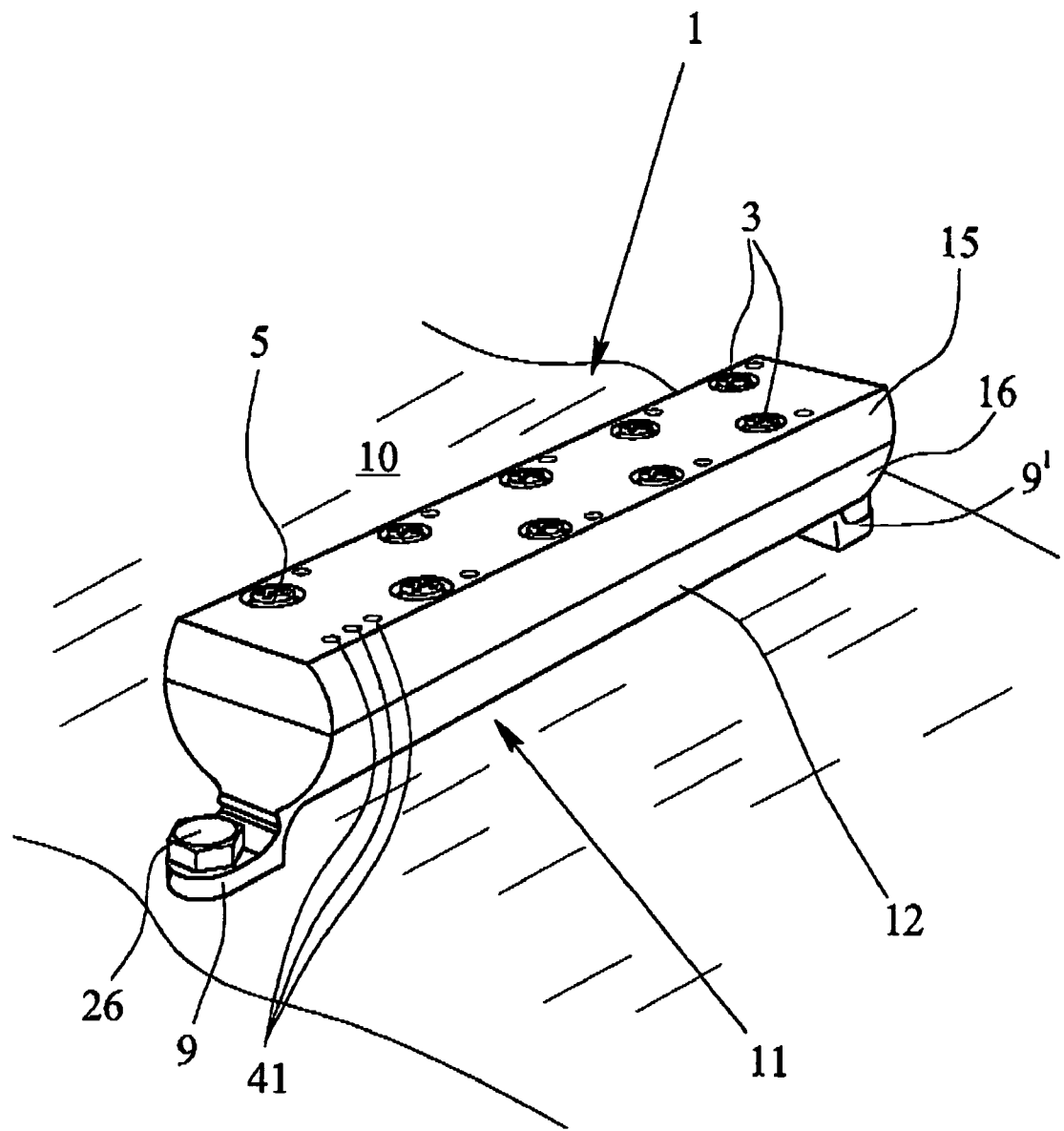
FIG. 6 is a perspective view of a second embodiment of the electronic module in accordance with the invention.

FIG. 6 shows another embodiment of the electronic module 1 in accordance with the invention with a housing 2 which is likewise made in two parts. However, the housing 2 does not have a round base area, but instead has an elongated shape with a housing bottom part 16 which is roughly semicircular in cross section and has two mounting feet 9, 9'. The mounting feet 9, 9' are directed outward so that cleaning of the intermediate space 11 between the support surface 10 and the bottom 12 of the housing is not hindered by the mounting feet 9, 9'. The feet 9, 9' have through openings for the screws 26 used to mount the module 1 to the support surface 10.

Both for the electronic module 1 as shown in FIGS. 1 to 4 and also for the electronic module 1 shown in FIG. 6, the housing 2 is preferably made of special steel with a relatively smooth surface so that the electronic module 1 is mechanically very stable and resistant to corrosive media. Overall the electronic module 1 is made such that it can also be used in the hygiene and foodstuffs fields since is can be easily cleaned.

What is claimed is:

1. Actuator-sensor module for connection of sensors or actuators to a bus line, comprising:
    a housing with an electronic unit enclosed in the housing, at least one jack or a plug for connection of sensors or actuators with at least one of electrical, optical, pneumatic and hydraulic lines, and with at least one jack or one plug for connection of at least one bus line,
    wherein the electronic unit connects the jack or plug for connection of the sensors or actuators to the at least one jack or one plug for connection of the at least one bus line,
    wherein the housing has a housing bottom and a housing top part, the at least one jack or plug for connection of sensors is arranged at the housing top part,
    wherein at least one mounting foot is provided at the housing bottom for mounting of the actuator-sensor module on a support surface and
    wherein, in an installed state of the actuator-sensor module with the at least one mounting foot affixed to the support surface, the housing bottom has an edge area which is farther from the support surface than is an area of the at least one mounting foot with the housing bottom having an increasing distance from the support surface in a direction from the mounting foot toward the edge area.

2. Actuator-sensor module as claimed in claim 1, wherein the housing bottom part has a sloping or arched bottom contour.

3. Actuator-sensor module as claimed in claim 2, wherein the housing top part is arched.

4. Actuator-sensor Electronic module as claimed in claim 1, wherein the housing top part is arched.

5. Actuator-sensor module as claimed claim 1, wherein the at least one jack and the at least one plug are made in one piece with the housing top part.

6. Actuator-sensor module as claimed in claim 1, wherein the housing has a round base surface and the housing has an ellipsoidal shape.

7. Actuator-sensor module as claimed in claim 6, wherein the housing has a top part with a thread and a bottom part with thread corresponding to that the housing top part for enabling the housing top and bottom parts to be screwed directly to one another.

8. Actuator-sensor module as claimed in claim 1, wherein the housing top part and the housing bottom part are connected to one another by being interlocked with each other by an edge of the housing top part extending around an edge of the housing bottom part, and the edges having been folded or crimped together.

9. Actuator-sensor module as claimed in claim 8, wherein a sealing element is located between an edge of the housing top part and an edge of the housing bottom part.

10. Actuator-sensor module as claimed in claim 1, wherein there is only a single mounting foot, said mounting foot being located in an area of a center axis of the housing.

11. Actuator-sensor module as claimed in claim 9, wherein the mounting foot has at least one screw and the housing is swivelable relative to the mounting foot.

12. Actuator-sensor module as claimed in claim 11, wherein the housing bottom part has a receiver for the mounting foot which has an insertion end, the receiver being provided with an inside groove and the insertion end being provided with a corresponding outside groove, and wherein a lock washer or a snap ring is inserted into at least one of said inside groove and said outside groove.

13. Actuator-sensor module as claimed in claim 11, wherein the housing is fixable in several positions relative to the mounting foot.

14. Actuator-sensor module as claimed in claim 13, wherein the housing bottom part has a receiver, and wherein at least one catch lever is provided in the receiver of the housing bottom part, said at least one catch lever interacting with a corresponding catch groove in the insertion end of the mounting foot.

15. Actuator-sensor module as claimed in claim 10, wherein the mounting foot is a punched and bent part having two legs which are arranged at an angle of less than 90 degrees with respect to one another.

16. Actuator-sensor module as claimed in claim 15, wherein a first of said two legs is connected to the housing bottom part and is semicircular in an upper area thereof.

17. Actuator-sensor module as claimed in claim 15, wherein a second of said two legs has an elongated hole for use in attaching the mounting foot to the support surface.

18. Actuator-sensor module as claimed in claim 15, wherein at least one stiffening bead is provided on the mounting foot in a transition area between the two legs thereof.

19. Actuator-sensor module as claimed in claim 15, wherein the mounting foot is welded to the housing bottom part.

20. Actuator-sensor module as claimed in claim 1, wherein there is at least one optical display element in the housing, and wherein at least one corresponding viewing window is provided in the housing top part.

21. Actuator-sensor module as claimed in claim 20, wherein the display elements are covered by a protective cap of transparent material, the protective cap being sealed relative to said window by a sealing element in the housing top part.

22. Actuator-sensor module as claimed in claim 21, wherein the housing is made of stainless steel.

* * * * *